US012704407B2

(12) United States Patent
Hu et al.

(10) Patent No.: US 12,704,407 B2
(45) Date of Patent: Aug. 11, 2026

(54) SUBSTRATE MEASUREMENT SYSTEMS HAVING SUBSTRATE HOLDERS

(71) Applicant: Applied Materials, Inc., Santa Clara, CA (US)

(72) Inventors: Chenfei Hu, Milpitas, CA (US); Chao Liu, San Jose, CA (US); Chien-Min Liao, San Jose, CA (US); Marc David Shull, Los Gatos, CA (US); Michael Kutney, Santa Cruz, CA (US)

(73) Assignee: Applied Materials, Inc., Santa Clara, CA (US)

( * ) Notice: Subject to any disclaimer, the term of this patent is extended or adjusted under 35 U.S.C. 154(b) by 21 days.

(21) Appl. No.: 18/650,486

(22) Filed: Apr. 30, 2024

(65) Prior Publication Data

US 2025/0334445 A1 Oct. 30, 2025

(51) Int. Cl.
*G01J 3/02* (2006.01)
*H10P 72/72* (2026.01)
*G01J 3/10* (2006.01)
*G01J 3/42* (2006.01)

(52) U.S. Cl.
CPC ............ *G01J 3/021* (2013.01); *H10P 72/722* (2026.01); *G01J 3/108* (2013.01); *G01J 2003/425* (2013.01)

(58) Field of Classification Search
CPC ...... G01J 3/021; G01J 3/108; G01J 2003/425; H01L 21/6833; H01L 21/02; H01L 21/683
See application file for complete search history.

(56) References Cited

U.S. PATENT DOCUMENTS 9,064,764 B2 * 6/2015 Pralle .................... H10F 39/024
9,589,799 B2 3/2017 Reddy
10,551,166 B2 2/2020 Ygartua
10,690,602 B2 6/2020 Sapiens
11,137,350 B2 10/2021 Wang
2004/0012776 A1 1/2004 Bae
2011/0076847 A1 * 3/2011 Aqui .................. C23C 14/5813 257/E21.575
2012/0024230 A1 2/2012 Li et al.
2013/0330848 A1 12/2013 Minato et al.
2014/0319784 A1 10/2014 Choi et al.
2016/0276203 A1 * 9/2016 Gratrix ............... H01L 21/6838
2016/0342096 A1 11/2016 Foad
2018/0082833 A1 3/2018 Kang
(Continued)

FOREIGN PATENT DOCUMENTS

CN 113130368 A 7/2021
CN 113314431 A 8/2021
(Continued)

OTHER PUBLICATIONS

Semiconductor, “Producer®Precision®APF®PECVD”, https://www.appliedmaterials.com/us/en/semiconductor/products/semiconductor-products/producer-precision-apf-pecvd.html, Apr. 18, 2024, 4 pages.
(Continued)

*Primary Examiner* — Abdullahi Nur
(74) *Attorney, Agent, or Firm* — Lowenstein Sandler LLP

(57) ABSTRACT

An apparatus includes a substrate holder having a surface to receive a substrate. The surface has a texture that causes an optical beam incident on the surface to scatter in at least one direction away from an optical detector to be located above the substrate holder.

18 Claims, 9 Drawing Sheets

(56) References Cited

U.S. PATENT DOCUMENTS

| | | | | |
|---|---|---|---|---|
| 2018/0308770 | A1* | 10/2018 | Sugaya | H01L 22/12 |
| 2019/0252233 | A1 | 8/2019 | Kim | |
| 2021/0050236 | A1 | 2/2021 | Ahn et al. | |
| 2023/0238266 | A1 | 7/2023 | Schulze | |

FOREIGN PATENT DOCUMENTS

| | | | | | |
|---|---|---|---|---|---|
| CN | 110323151 | B | * | 12/2021 | H01L 21/67063 |
| JP | 2005089860 | A | | 4/2005 | |
| JP | 2009133678 | A | | 6/2009 | |
| JP | 2013102053 | A | * | 5/2013 | |
| JP | 2015094002 | A | | 5/2015 | |
| JP | 2019071267 | A | * | 5/2019 | H05B 33/10 |
| KR | 20100109448 | A | | 10/2010 | |
| WO | WO-2013078141 | A1 | * | 5/2013 | H01L 21/67207 |
| WO | 2023177967 | A1 | | 9/2023 | |

OTHER PUBLICATIONS

Semilab, "Characterization of 3D Structures", https://semilab.com/category/products/characterization-of-3d-structures, downloaded from the website on Mar. 11, 2024, 4 pages.

International Search Report and Written Opinion for International Application No. PCT/US2025/026875, mailed Aug. 13, 2025, 10 Pages.

International Search Report and Written Opinion for International Application No. PCT/US2025/026883, mailed Aug. 14, 2025, 9 Pages.

* cited by examiner

SUBSTRATE MEASUREMENT SYSTEMS HAVING SUBSTRATE HOLDERS

TECHNICAL FIELD

Some embodiments of the disclosure relate, in general, to metrology systems. In particular, some embodiments relate to substrate measurement systems having substrate holders.

BACKGROUND

Manufacturing of modern materials often involves various deposition techniques, such as chemical vapor deposition (CVD) or physical vapor deposition (PVD) techniques, in which atoms of one or more selected types are deposited on a substrate (wafer) held in low or high vacuum environments that are provided by vacuum deposition chambers. Materials manufactured in this manner may include monocrystals, semiconductor films, fine coatings, and numerous other substances used in practical applications, such as electronic device manufacturing. Many of these applications rely on the purity and uniformity of the materials grown in substrate processing systems as well as uniformity of the processes. The goal of uniformity gives rise to the monitoring and measuring the uniformity of substrates and manufacturing processes. Improving precision, reliability, and efficiency of such techniques presents a number of technological challenges.

SUMMARY

In some embodiments, an apparatus is provided. The apparatus includes a substrate holder having a surface to receive a substrate. The surface has a texture that causes an optical beam incident on the surface to scatter in a direction away from an optical detector to be located above the substrate holder.

In some embodiments, a system is provided. The system includes a substrate holder having a surface to receive a substrate, and an optical detector located above the substrate holder. The surface has a texture that causes an optical beam incident on the surface to scatter in at least one direction away from the optical detector.

In some embodiments, a method is provided. The method includes causing, by at least one processing device, at least one optical beam to be directed toward a substrate secured to a surface of a substrate holder, receiving, by the at least one processing device, at least one reflected optical beam for processing, and processing, by the at least one processing device, the at least one reflected optical beam to determine at least one property of the substrate. The surface has a texture that causes the at least one optical beam incident on the surface to scatter in a direction away from an optical detector located above the substrate holder.

BRIEF DESCRIPTION OF THE DRAWINGS

The disclosure is illustrated by way of example, and not by way of limitation, in the figures of the accompanying drawings in which like references indicate similar elements. It should be noted that different references to “an” or “one” embodiment in this disclosure are not necessarily to the same embodiment, and such references mean at least one.

DETAILED DESCRIPTION

Figure 1:
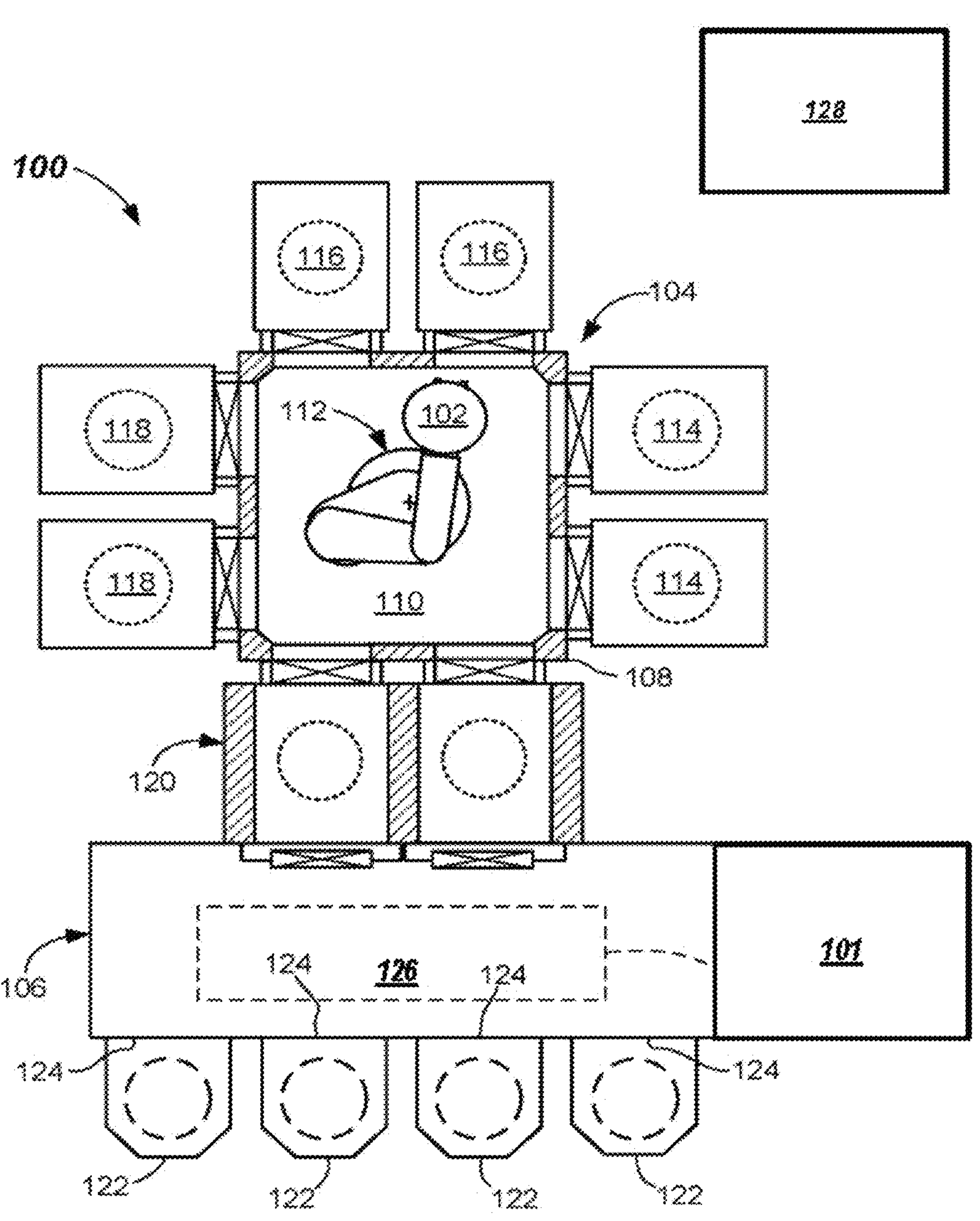
FIG. 1 is a top schematic view of an example processing system, according to one embodiment.

Embodiments described herein are related to substrate measurement systems (or devices) having substrate holders. A substrate holder can be a component of a substrate measurement system, which can be, for example, an optical measurement system. A substrate measurement system can be used for measuring film thickness and other parameters such as critical dimensions (CDs), CD-bias (delta between process steps), and other physical parameters related to the substrate processing outcome across all or a portion of a surface of a substrate after the substrate is processed in a processing chamber. Process results, including film thicknesses, CDs, CD-bias, and so on can be monitored across one or more substrates for etch and deposition processes. Film thickness information, CD information, CD-bias information, etc. can be used to monitor process drifts, which can lead to non-uniformities across the surface of the substrate.

A substrate measurement system can be coupled to or integrated into a factory interface of an electronic device manufacturing system. The substrate measurement system can be used to measure a surface of a substrate while the substrate is still in the device manufacturing system. This enables any issues such as film non-uniformity to be detected before many more substrates are processed by a processing chamber that caused the film non-uniformity. For example, a substrate measurement system can be used to monitor process drifts and measure uniformity of substrates after processing. The substrate measurement system can have a small footprint due to a unique design, which enables the substrate measurement system to be integrated into a transfer chamber or a factory interface, or attached to a transfer chamber or factory interface without consuming significant factory floor space. The substrate measurement system, in some embodiments, generates an accurate wafer map of a wafer, even when the wafer is not centered on a substrate support.

A substrate measurement system can provide information on and/or alerts of film thickness problems, non-uniformity, process drifts, CDs, CD-bias, and other physical parameters related to the substrate processing outcome to a user quickly, effectively in real time, which can allow the user to correct for film thickness, CD, CD-bias, etc. problems, non-uniformity, process drifts, etc. as they occur. Additionally, aspects of the present disclosure solve the above-mentioned problems and other problems by utilizing a reflectometry and/or other measurement system that includes a substrate support that both rotates and moves linearly to enable a sensor (e.g., an optical sensor) to capture measurements of points across the surface of the substrate.

A substrate support can include a substrate holder to receive and secure a substrate. The substrate holder can include a device that applies a gripping force on the substrate to secure the substrate to the surface of the substrate holder. In some embodiments, the substrate holder includes a chuck to secure the substrate. Examples of chucks include vacuum chucks, electrostatic chucks, magnetic chucks, mechanical chucks (a four jaw chuck, a three jaw chuck, an edge/ring clamp chuck, etc.) or other type of chuck. Additionally, a substrate holder can include a pedestal. In some embodiments, a substrate holder includes a heater.

A substrate measurement system can additionally include a camera or other sensor usable to locate an edge of the substrate secured on the substrate support. The substrate support can be moved in a linear motion until the camera and/or sensor detects the edge. The substrate support can be moved in a rotational manner to determine a center of the substrate, which may not be centered on the substrate support. Once the center of the substrate is determined relative to the center of the substrate support, coordinate transformations can be applied while the substrate is rotated in order to cause an appropriate linear movement of the substrate support to correct for the center of the substrate being offset from a center of the substrate holder. Thus, measurements can be generated for many points on the substrate (e.g., for the entire surface of the substrate), and each measurement can be associated with an accurate location on the substrate.

A substrate measurement system can include a reflectometry system. Reflectometry is a measurement technique that uses measured changes in light reflected from an object to determine geometric and/or material properties of the object. A reflectometry system can include an optical detector (e.g., spectrometer) that can receive light reflected off of the substrate, and measure the intensity of reflected light across a range of wavelengths. For dielectric films these intensity variations can be used to determine the thickness of the film. Additionally, reflectometry measurements can be used to detect CD, CD-bias, and other physical parameters related to a substrate processing outcome.

A substrate measurement system can cinlude an infrared (IR) reflectometer. For example, the substrate measurement system can include a mid-infrared (MIR) reflectometer. MIR refers to a region of the IR spectrum between near-IR and far-IR, with optical waves having wavelengths that are longer than near-IR. For example, a MIR optical wave can have a wavelength that ranges between about 2.5 micrometers (μm) to about 50 μm.

A substrate measurement system including a reflectometer (e.g., MIR reflectometer) can perform reflectometry for various metrology applications. For example, the substrate measurement system can cause an optical beam having a wavelength (e.g., MIR wavelength) to penetrate through a thick absorbing hardmask layer formed on a substrate, and a reflected optical beam can carry information related to the substrate to a detector (material thickness, top and/or bottom CD, etc.)

At some wavelengths (e.g., MIR wavelengths), due to partial transmission and reflection of some substrate materials in the spectrum (e.g., silicon (Si) substrates), an optical beam reflected from the substrate holder may generate unwanted background noise signals. Some substrate measurement systems address such unwanted background noise signals by implementing optical systems that block optical beams reflected from the substrate holder. However, such optical systems can be intricate systems that require micro-level precision of fabrication, alignment and/or maintenance, which make them non-ideal for a compact integrated module.

Aspects and embodiments of the present disclosure address these and other technological challenges by providing for substrate measurement systems having substrate holders designed to minimize noise signal reflection. A substrate holder described herein can include a chuck used to secure the substrate to the substrate holder. More specifically, a substrate measurement system can include a substrate holder can have a surface to receive a substrate, and an optical detector located above the substrate holder (and the substrate). The term “located above” generally refers to the optical detector being located at any position above the substrate holder, and is not limited to the optical detector being located directly above the substrate holder. For example, the optical detector can be located directly above the substrate holder, angled to the side above the substrate holder, etc.

The surface of the substrate holder can be designed to minimize noise signal reflection toward the optical detector. More specifically, an optical beam incident on the surface of the substrate holder can be scattered or diffused in at least one direction away from an optical detector. For example, the surface of the substrate holder can have a texture designed to minimize noise signal reflection. The texture can have a corresponding surface roughness and/or porosity that can minimize optical beam reflection of the substrate holder toward the optical detector, while allowing gas and/or vacuum flow for chucking and/or other purposes. As another example, the surface of the substrate holder can be treated with a material (e.g., film) designed to minimize noise signal reflection. A substrate holder described herein can be fabricated using any suitable technique. Examples of techniques include laser cutting, additive manufacturing (e.g., 3D printing), etc.

Advantages of embodiments described herein include reduced substrate holder reflection of optical signals, which can reduce the amount the signal noise measured by optical detectors of substrate measurement systems.

FIG. 1 is a top schematic view of an example processing system 100, according to some embodiments. In some embodiments, processing system 100 can be an electronics processing system configured to perform one or more processes on a substrate 102. In some embodiments, processing system 100 can be an electronics device manufacturing system. Substrate 102 can be any suitably rigid, fixed-dimension, planar article, such as, e.g., a silicon-containing disc or wafer, a patterned wafer, a glass plate, or the like, suitable for fabricating electronic devices or circuit components thereon.

Processing system 100 includes a process tool 104 (e.g., a mainframe) and a factory interface 106 coupled to process tool 104. Process tool 104 includes a housing 108 having a transfer chamber 110 therein. Transfer chamber 110 is operatively coupled to one or more processing chambers 114, 116, 118 disposed therearound. Processing chambers 114, 116, 118 can be coupled to transfer chamber 110 through respective ports, such as slit valves or the like.

Processing chambers 114, 116, 118 can be adapted to carry out any number of processes on substrates 102. A same or different substrate process can take place in each processing chamber 114, 116, 118. Examples of substrate processes include atomic layer deposition (ALD), physical vapor deposition (PVD), chemical vapor deposition (CVD), etching, annealing, curing, pre-cleaning, metal or metal oxide removal, or the like. In one example, a PVD process is performed in one or both of processing chambers 114, an etching process is performed in one or both of processing chambers 116, and an annealing process is performed in one or both of processing chambers 118. Other processes can be carried out on substrates therein. Processing chambers 114, 116, 118 can each include a substrate support assembly. The substrate support assembly can be configured to hold a substrate in place while a substrate process is performed.

Transfer chamber 110 also includes a transfer chamber robot 112. Transfer chamber robot 112 can include one or multiple arms, where each arm includes one or more end effectors at the end of the arm. The end effector can be configured to handle particular objects, such as wafers. In some embodiments, transfer chamber robot 112 is a selective compliance assembly robot arm (SCARA) robot, such as a 2 link SCARA robot, a 3 link SCARA robot, a 4 link SCARA robot, and so on.

A load lock 120 can also be coupled to housing 108 and transfer chamber 110. Load lock 120 can be configured to interface with, and be coupled to, transfer chamber 110 on one side and factory interface 106 on another side. Load lock 120 can have an environmentally-controlled atmosphere that is changed from a vacuum environment (where substrates are transferred to and from transfer chamber 110) to at or near an atmospheric-pressure inert-gas environment (where substrates are transferred to and from factory interface 106) in some embodiments. In some embodiments, load lock 120 is a stacked load lock having a pair of upper interior chambers and a pair of lower interior chambers that are located at different vertical levels (e.g., one above another). In some embodiments, the pair of upper interior chambers are configured to receive processed substrates from transfer chamber 110 for removal from process tool 104, while the pair of lower interior chambers are configured to receive substrates from factory interface 106 for processing in process tool 104. In some embodiments, load lock 120 are configured to perform a substrate process (e.g., an etch or a pre-clean) on one or more substrates 102 received therein.

Factory interface 106 can be any suitable enclosure, such as, e.g., an Equipment Front End Module (EFEM). Factory interface 106 can be configured to receive substrates 102 from substrate carriers 122 (e.g., Front Opening Unified Pods (FOUPs)) docked at various load ports 124 of factory interface 106. A factory interface robot 126 (shown dotted) can be configured to transfer substrates 102 between substrate carriers 122 (also referred to as containers) and load lock 120. In other and/or similar embodiments, factory interface 106 is configured to receive replacement parts from replacement parts storage containers 123. Factory interface robot 126 can include one or more robot arms and can be or include a SCARA robot. In some embodiments, factory interface robot 126 has more links and/or more degrees of freedom than transfer chamber robot 112. Factory interface robot 126 can include an end effector on an end of each robot arm. The end effector can be configured to pick up and handle specific objects, such as wafers. Alternatively, or additionally, the end effector can be configured to handle objects such as process kit rings.

Any suitable robot type can be used for factory interface robot 126. Transfers can be carried out in any order or direction. Factory interface 106 can be maintained in, e.g., a slightly positive-pressure non-reactive gas environment (using, e.g., nitrogen as the non-reactive gas) in some embodiments.

Processing system 100 can include a substrate measurement system 101 (e.g., integrated substrate measurement system). In some embodiments, the substrate measurement system 101 includes a reflectometry system. In some embodiments, the substrate measurement system includes a MIR reflectometry system.

The substrate measurement system 101 can be connected to factory interface 106. Alternatively, the substrate measurement system 101 can be connected to transfer chamber (e.g., at a location of one of the illustrated processing chambers). Alternatively, the substrate measurement system 101 can be positioned in an interior of the factory interface 106 or transfer chamber 110. The substrate measurement system 101 may also be a standalone system that is not connected to processing system 100. The substrate measurement system system 101 can be mechanically isolated from factory interface 106 and from an external environment to protect substrate measurement system 101 from external vibrations. In some embodiments, the substrate measurement system 101 and its contained components may provide analytical measurements (e.g., thickness measurements) that may provide a profile across a surface of a substrate, such as a thickness uniformity profile, a particle count profile, a CD profile, a CD uniformity profile, an optical constant profile, a material property profile, and so on. The substrate measurement system 101 may provide feedback to a user regarding the uniformity profile. The substrate measurement system 101 can be an assembly that has the ability to measure film thicknesses, CD, CD-bias, optical properties, particle count, material properties, surface roughness, etc. across the entire substrate after it is processed in a chamber. Such metrology can be used to monitor process drift, out-of-specification film thickness, out-of-specification CD, CD-bias, etc. for etch, deposition, and/or other processes. The results of the measurement can be used to quickly correct or adjust process parameters of one or more process recipes executed on one or more processing chambers to account for any determined process drift. Additionally, the results of the measurements can be used to determine when to perform maintenance on a processing chamber, when to perform further testing on a substrate, when to flag a substrate as being out-of-specification, and so on. Although depicted as being connected to factory interface 106, in other embodiments, the substrate measurement system 101 can be a standalone reflectometry system or can be positioned at another location in or attached to the processing system 100, as described above.

Factory interface robot 126 may place a substrate on a substrate transfer lift (e.g., lift pins) of the substrate measurement system 101. In one embodiment, the substrate transfer lift may then lower the substrate onto a substrate support such as a chuck (e.g., a vacuum chuck or electrostatic chuck) of the substrate measurement system 101. In other embodiments, the substrate may instead be lowered onto another type of substrate holder, such as a mechanical chuck, a magnetic chuck, or the like. The substrate measurement system 101 may include various covers and a ventilation system to maintain a clean substrate and environment.

Within the substrate measurement system 101, the substrate holder can be translated by a linear actuator so that an edge of the substrate is centered under an optical camera. The substrate and the substrate holder may then be rotated by a rotation motor (actuator) and an optical camera or first sensor (e.g., an IR sensor, visible light sensor, etc.) may capture images or measurements of the edge of the substrate. Motion of the substrate holder about a rotational axis can be referred to as theta motion, motion of the substrate holder along a linear axis can be referred to as r motion, and combined motion of the substrate holder about the rotational axis and along the linear axis can be referred to as r-theta motion herein. As will be described in further detail below, the images or measurements can be analyzed to determine a center point of the substrate. Moving the substrate holder with both a linear (e.g., radial) and rotational motion allows the total size of substrate measurement system 101 to be minimized while still enabling the capturing of measurements along the entire surface of the substrate. For example, the substrate measurement system 101 may have a width of about 16"-17", a length of about 23"-24", and a height of about 25"-26" in an embodiment. In some embodiments, the substrate measurement system 101 can be implemented with two linear actuators and no rotational actuator (where motion for such as a system is referred to as X-Y motion), however, this may lead to the substrate measurement system having a larger footprint than substrate measurement system 101. In some embodiments, the substrate measurement system 101 may have the capability to measure film thicknesses, CD, CD-bias, etc. of up to about 100 substrates or more per hour, which is a substantial increase in throughput as compared to traditional optical metrology systems that measure a full surface of a substrate. For each substrate, hundreds to thousands (e.g., 3000) points on each substrate can be measured. The measurements can be used to determine uniformity profiles of the substrates. Accordingly, in some embodiments, the substrate measurement system 101 can determine a uniformity profile of a substrate in a time duration between 20 seconds and 50 seconds.

A second sensor (e.g., a reflectometer) of the substrate measurement system 101 can be used to make measurements of one or more target positions on the substrate as it is moved by the linear actuator and the rotational motor. The one or more target positions can be determined based on an algorithm or set of instructions that specifies the location of the target positions and the number of target positions to be measured. In some instances, the substrate may not be centered on the substrate holder. In such an instance, processing logic may determine coordinate transformations to transform between a coordinate system centered on the substrate holder and a coordinate system centered on the substrate. Appropriate transformations can be applied for each position to be measured on the substrate. Accordingly, as the substrate holder (and thus the substrate attached to the substrate holder) are rotated, the substrate holder and the substrate are also moved linearly according to the transformations so that the correct point on the substrate is measured.

During setup of the substrate measurement system 101, the linear actuator and the rotational motor can be calibrated to determine the location of the reflectometer in relation to the axes of motion of the linear actuator and/or the rotational motor. Additionally, the substrate holder may have an integrated reference target (or multiple integrated reference targets), which can be measured by the second sensor (e.g., reflectometer) and/or captured by the first sensor (e.g., camera) to obtain reference measurements/images. The integrated reference target(s) can be positioned on the substrate holder and/or on a stage that supports the substrate holder at a position that will not be covered by the substrate, and may rotate and/or otherwise change position as the substrate holder is rotated and/or moved. An integrated reference target may have a known thickness, which does not change over time.

In some embodiments, the substrate measurement system 101 includes multiple reference targets, which can be made of different materials. For example, one reference target may include bare silicon, and one reference target may include silicon with a silicon dioxide layer having a known thickness. The sensor may periodically measure the thickness of the integrated reference target and compare the measured thickness to the known thickness of the integrated reference target. If the measured thickness does not correspond to the known thickness of the target, then processing logic may determine that the sensor is generating inaccurate measurements. In some embodiments, a linear offset can be determined based on a determined difference between the measured thickness and the known thickness of the integrated reference target. Alternatively, a non-linear offset can be determined. The linear or non-linear offset can be applied to measurements in order to obtain accurate adjusted measurements of film thickness. In one embodiment, processing logic determines whether the difference between the measured thickness of the reference target and the known thickness of the reference target exceeds a difference threshold. If the difference is below the difference threshold, then an adjustment can be applied, as described above. If the difference is at or above the difference threshold, then the substrate measurement system 101 can be scheduled for maintenance. The substrate measurement system 101 may perform calibration of the second sensor (e.g., reflectometer) either between measurements, during measurements, or both to determine appropriate offsets to apply to measurements.

In some embodiments, the integrated reference target may cause spectral reflections on the second sensor (e.g., reflectometer) from when it scans across the reference target while setting the stage. Processing logic can determine where the second sensor is relative to the target based on the positions (e.g., (r, theta) coordinates) at which spectral reflections are captured. A similar process can be determined for the first sensor (e.g., the camera). This can provide two coordinate systems that are both referenced by the target. The relationship between the first sensor coordinate system and the second sensor coordinate system can therefore be figured out through the reference target.

When the substrate is lowered onto and secured to the substrate holder, the center of the substrate can be offset from the center of the substrate holder. A processing device of the substrate measurement system 101 may determine one or more coordinate transformations between the center of the substrate and the center of the substrate holder (the center of the substrate holder corresponds to the axis of rotation about which the substrate holder rotates), and apply the one or more coordinate transformations to correct the offset.

Processing system 100 can also include a system controller 128. System controller 128 can be and/or include a computing device such as a personal computer, a server computer, a programmable logic controller (PLC), a microcontroller, and so on. System controller 128 can include one or more processing devices, which can be general-purpose processing devices such as a microprocessor, central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device can also be one or more special-purpose processing devices such as an application specific integrated circuit (ASIC), a field programmable gate array (FPGA), a digital signal processor (DSP), network processor, or the like. System controller 128 can include a data storage device (e.g., one or more disk drives and/or solid state drives), a main memory, a static memory, a network interface, and/or other components. System controller 128 can execute instructions to perform any one or more of the methodologies and/or embodiments described herein. The instructions can be stored on a computer readable storage medium, which can include the main memory, static memory, secondary storage and/or processing device (during execution of the instructions). System controller 128 can also be configured to permit entry and display of data, operating commands, and the like by a human operator.

Figure 2A:
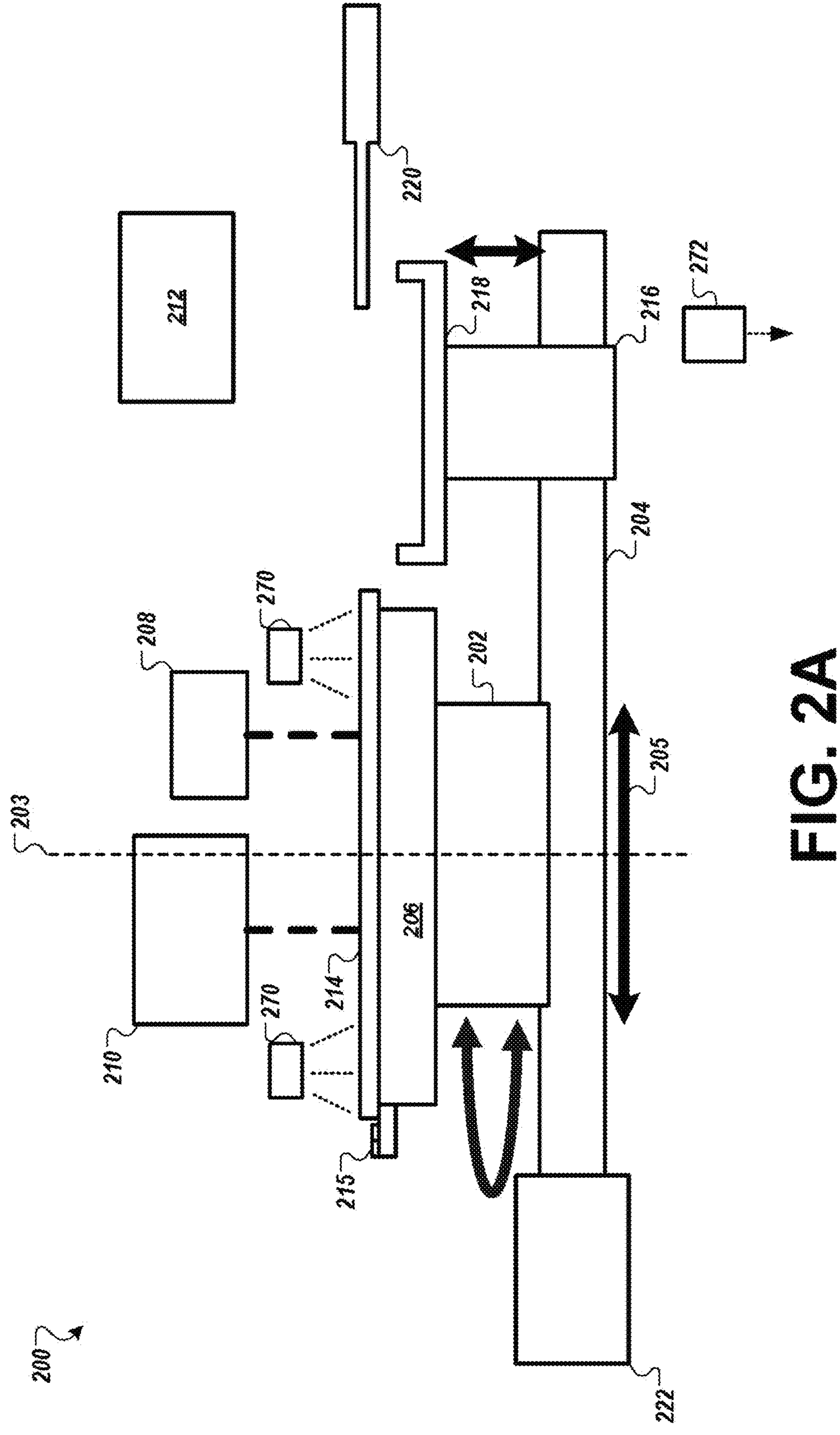
FIG. 2A is a cross-sectional schematic diagram of a substrate measurement system with a rotational actuator and a linear actuator, according to some embodiments.

FIG. 2A is a schematic cross-sectional side view diagram of a substrate measurement system ("system") 200 with a rotational actuator 202 and a linear actuator 204 according to some embodiments. The system 200 may correspond to substrate measurement system 101 of FIG. 1 in embodiments. Rotational actuator 202 can be a motor, a rotary actuator (e.g., an electric rotary actuator), or the like. Linear actuator 204 can be an electric linear actuator, which may convert rotational motion in motors into linear or straight motions along an axis. The system 200 may include a substrate holder 206, a camera 208, a sensor 210, and a processing device 212.

Substrate holder 206 can be a chuck such as a vacuum chuck, an electrostatic chuck, a magnetic chuck, a mechanical chuck (e.g., a four jaw chuck, a three jaw chuck, an edge/ring clamp chuck, etc.) or other type of chuck. Substrate holder 206 may also be or include a plate or other surface with a substrate-shaped pocket and/or a set of pins or other features (e.g., three pins) that surround the substrate and keep the substrate from shifting relative to the substrate holder 206 during movement of the substrate holder 206. Substrate holder 206 may secure a substrate 214 (e.g., a wafer). In one embodiment, the substrate holder 206 includes an edge clamp that clamps the substrate from the edges. In one embodiment, substrate holder 206 is a vacuum chuck. In other embodiments, substrate holder 206 can be a different type of chuck such as an electrostatic chuck, a mechanical chuck, a magnetic chuck, or the like.

Rotational actuator 202 may rotate substrate holder 206 about a first axis 203. Rotational actuator 202 can be controlled by a servo controller and/or servomotor, which may allow for precise control of a rotational position, velocity and/or acceleration of the rotational actuator and thus of substrate holder 206. Substrate holder 206 may have a mass between 1.0 kilograms (kg) and 2.0 kg, which allows for rotational accelerations between 6000 deg/sec$^2$ and 14000 deg/sec$^2$. Linear actuator 204 may move substrate holder 206 linearly along a second axis 205. Linear actuator 204 can be controlled by a servo controller and/or servomotor 222, which may allow for precise control of a linear position, velocity, and acceleration of linear actuator 204, and thus of substrate holder 206.

Camera 208 can be positioned above substrate holder 206, and may generate one or more images of substrate 214 held by substrate holder 206. Camera 208 can be an optical camera, an infrared camera, or other suitable type of camera. Alternatively, camera 208 can be replaced by another type of sensor. A sensor 210 may also be positioned above substrate holder 206, and may measure at least one target position on the substrate at a time. Depending on a sensor type of sensor 210, the measurement can be a reflectometry measurement, an optical property measurement, a particle count measurement, a CD measurement, a roughness measurement, a surface texture measurement, and/or other type of measurement. Camera 208 (or other sensor) and sensor 210 can be fixed in a stationary position on the system 200, while substrate holder 206 can be moved in an r-theta motion by rotation actuator 202 and linear actuator 204.

In some embodiments, due to the capability of the chuck to be moved according to an r-theta motion, outer dimensions of substrate measurement system can be compact, (e.g., having dimensions between 20 inches and 28 inches in a first dimension, 22 inches and 28 in a second dimension, and 14 inches and 20 inches in a third dimension, with the first dimension, the second dimension, and the third dimension being mutually perpendicular), in comparison to an substrate measurement system which moves the chuck in a rectangular (XY) motion system. In addition, by moving the chuck using an r-theta motion system, substrates can be processed (e.g., their uniformity profile can be determined) at a rate of up to 100 substrates per hour or more. In other words, processing device 212 can generate thickness measurements of an entire substrate 214 and determine a uniformity profile of the substrate 214 in a time duration between 20 seconds and 50 seconds in embodiments.

In some embodiments, processing device 212 may determine, based on the one or more images or other measurements of substrate 214 generated by camera 208 or other sensor, that substrate 214 is not centered on substrate holder 206 and/or an estimate of a position of the substrate on the chuck (e.g., an estimate of the center of the substrate on the chuck). Substrate 214 can be not centered on substrate holder 206 when it is initially placed on substrate holder 206. A robot blade 220 may place substrate 214 on a transfer station 218 (e.g., on a set of lift pins or other lift mechanisms). Substrate holder 206 can be moved in a first direction along second axis 205 such that substrate holder 206 is positioned at transfer station 218. Transfer station 218 can be situated on a lift mechanism 216 (or can be a set of lift pins), which may move transfer station 218 up and down in a vertical direction (that is perpendicular to second axis 205 and parallel to first axis 203). Substrate 214 can be received by substrate holder 206 while substrate holder 206 is positioned at transfer station 218. Substrate 214 may not be centered on substrate holder 206. Substrate holder 206 can be moved in a second direction along second axis 205 until an edge of substrate 214 is detected to be at a target position by sensor 210.

The substrate holder 206 can be rotated 360 degrees, and images or other measurements (optionally referred to as edge images or circumference images) can be generated during the rotation of the substrate holder 206. One or more of the measurements and/or images can be taken with the substrate holder at different theta values, and the detected location of the edge may vary. A change in the detected edge may indicate that the substrate (which can be a circular substrate) is off center. Additionally, the determined change in the detected edge can be used to compute the amount of offset. Because the camera, sensor and stage are synchronized, a circumference image scan can be achieved in 3-6 seconds without stopping the stage in embodiments.

Edge images (e.g., image frames) can be analyzed by an image processing system. The image processing system detects the edge of the substrate and a position of a flat or notch in the substrate. In some embodiments, the system 200 is connected to an illumination system (e.g., comprising one or more light sources such as light emitting diodes (LEDs)) that can turn on and off when camera measurements and/or sensor measurements (e.g., spectrometer measurements) are collected. In one embodiment, the image processing system corrects for illumination nonuniformity and finds a boundary of the wafer edge. The edge positions for each image frame can be input into a circle fitting least-squares optimization algorithm. A notch (or flat) angle can be determined by combining the angle of the image with the most probable notch or flat candidate and the position of the notch or flat within the image. The fitted circle can be the center of the substrate, and the notch angle can be the angular offset.

In one embodiment, in addition to or instead of generating images of an edge of the substrate, a camera generates images of features (e.g., alignment features) on the surface of the substrate. The features may have known positions on the substrate, and can be used to determine a center of the substrate in embodiments. In some embodiments, an initial estimate of a center of the substrate is determined based on images of an edge of the substrate, and a refined or improved estimate of the center of the substrate is determined based on images of the features on the surface of the substrate.

In one embodiment, the parameters (r, theta) determine the offset of the substrate relative to the stage. With these parameters, the motion system can create forward and inverse transformations that converts (r, theta) coordinates of the stage to (r, theta) coordinates of the substrate. The motion system can then compute trajectories in the space of the substrate while sending commands to move the motors attached to the substrate holder 206. In one embodiment, the motion system can compute trajectories in an arbitrary space because it runs a real-time control software that is connected to the motion drives of the linear actuator and the rotational actuator through a network. Controller 212 may compute the corrected trajectory and transmit commanded positions to the motion drives in real-time (e.g., at a 1 kHz rate).

In some embodiments, additional calibrations are performed to determine one or more of the following:

1. A camera stage/chuck origin defined by the stage/chuck center of rotation;
2. A camera misalignment with the stage/chuck center of rotation;
3. A camera mounting error; and
4. A boresight correction between the sensor and the camera;
5. One or more additional calibrations to address, for example, tip, tilt and/or wobble.

The calibrations can be used to compute a sensor-stage origin and transformations applied to camera measurements and/or sensor measurements. The calibrations may ensure that the sensor measurements and/or camera measurements are accurate with respect to absolute substrate coordinates. Optics heads of the sensor (e.g., reflectometer) and the camera may have adjustments to place them approximately on a center of the rotation axis (e.g., center of the chuck) in embodiments. Additionally, alignment algorithms can add additional accuracy to the measurement position beyond mechanical adjustment tolerances.

In some embodiments, a sensor such as an IR sensor, laser sensor or other light sensor can be used to detect the substrate edge in addition to, or instead of, a camera 208. The IR sensor, laser sensor or other light sensor may include one or more light source or emitter and one or more detector, or one or more light source/detector and one or more mirror. In one embodiment, while no substrate is interposed between a light emitter (e.g., a laser, IR emitter or other light emitter) and the detector, or between a source/detector and the mirror, then no substrate is detected by that detector. However, once the substrate is interposed between a light source and detector, or between a source/detector and a mirror, a beam is broken and the substrate is detected. The r-theta coordinates accompanied by data on whether or not the substrate was detected at multiple r-theta coordinates can be used to determine that the substrate is off center and/or an amount of offset. In embodiments, a single light source and detector pair or a single light source/detector and mirror pair are used. Alternatively, multiple light source and detector pairs or multiple light source/detector and mirror pairs can be used. The multiple light source and detector pairs or light source/detector and mirror pairs can be arranged in a detection array in embodiments. If multiple light source and detector pairs or light source/detector and mirror pairs are used, then these pairs can be arranged such that they provide a light curtain. The light curtain may provide multiple data points for detection of the substrate.

In some embodiments, the substrate includes a notch and/or a flat. The images from camera 208 and/or the sensor measurements from a sensor (e.g., an edge sensor such as an IR or laser sensor) can be used to determine a location of a flat and/or notch. X-Y positions can be determined on the substrate based on the determined location of the flat or notch. The X-Y positions can be translated into r-theta positions, and r-theta positions can be translated into X-Y positions.

In some embodiments, the rotation of substrate holder 206 by rotational actuator 202 for measurement of a target position causes an offset between a field of view of sensor 210 and the target position on substrate 214 due to substrate 214 not being centered on substrate holder 206. In this case, linear actuator 204 may move substrate holder 206 linearly along the second axis to correct the offset. Then, sensor 210 may measure target positions on substrate 214. Once measurements of all target points on the substrate are measured, processing device 212 may determine a uniformity profile across the surface of substrate 214 based on the measurements.

The motion system of the system 200 (e.g., the linear actuator 204 and the rotational actuator 206) can be synchronized with the camera 208 and/or sensor 210, such as through digital trigger signals sent over a network. Drives of the motion system can be connected to a real-time control server through the network, for example. The network enables the linear actuator 204 and/or rotational actuator 206 to receive and act on commands. The control network enables processing logic to transform the coordinates and path of measurements on the wafer.

In some embodiments, processing device 212 may determine one or more coordinate transformations between a center of substrate holder 206 (corresponding to first axis 203 about which substrate holder 206 rotates) and a center of substrate 214 that are applied during the rotation of substrate holder 206 to correct for the offset.

In some embodiments, in order to identify the center of substrate 214, sensor 210 may identify a number of points on an edge of substrate 214 (either via measurements or via images from camera 208), and fit those points to a circle using one or more techniques, such as using a regression analysis fitting technique. In other words, the edge positions for each image can be fed into optimization circle fitting algorithm to determine a circle. A notch angle can be found by combining an angle of the image with a most-probable notch candidate and the position of the notch within the image. The fitted circle is indicative of the center of substrate 214, and the notch angle is indicative of the angular offset.

In some embodiments, in order to identify the center and orientation of substrate 214 with higher accuracy, sensor 210 may measure positions of a number of substate alignment targets via images from camera 208. Substrate alignment targets may include substrate marks, patterns, lines, edges, corners, and/or the like. One or more training images of substrate alignment targets can be stored on processing system 100. Images of the substrate alignment targets can be captured and compared with training images to determine translation. Embodiments can determine translation with sub-pixel accuracy by image registration algorithms using techniques such as fast Fourier transform (FFT) methods or convolutional neural network (CNN) deep learning methods. The image registration translation between substrate alignment targets and training images form position measurements of alignment targets. The position measurement of multiple substrate alignment targets can be used to fit a coordinate transformation giving additional accuracy. The measurements can be combined using a fitting algorithm (e.g. least squares) to refine the estimate of substrate center and orientation.

Some embodiments may identify substrate center and orientation with edges and a notch. Some embodiments may identify substrate center and orientation with substate alignment targets. Some embodiments may identify substate center and orientation in two steps with step one finding edges and notch; and step two finding substrate alignment targets.

In one embodiment, the sensor 210 and camera 208 (or other sensor) are mounted to a structure that is in turn mounted to a plate. The chuck and actuators may also be mounted to the plate. Thus, the entire system including the moving parts (e.g., chuck, actuators, etc.) and the measurement devices (e.g., camera and sensor) may all be mounted to the same plate, which is isolated from an external environment. This provides vibration isolation to the sensors as well as to the chuck from an external environment (e.g., a factory interface), and improves accuracy of measurements.

In one embodiment, one or more integrated reference targets 215 are attached to one end of the substrate holder 206. In one embodiment, the one or more integrated reference targets 215 include a silicon reference target and a silicon dioxide reference target. The one or more integrated reference targets 215 can be used to maintain calibration of sensor 210. In one embodiment, at least one of the one or more integrated reference targets 215 includes a coating (e.g., of silicon dioxide) having a known thickness, optical property or properties, material property or properties, particle count, etc. Sensor 210 may periodically measure a thickness and/or other property of the coating on the integrated reference target 215. The measured thickness and/or other property may then be compared to the known thickness and/or other property of the coating. If the measured thickness and/or other property does not match the known thickness and/or other property, then a determination can be made that the sensor 210 is not correctly calibrated. In one embodiment, a difference between a measured thickness and a known thickness is determined. The difference may then be compared to one or more difference thresholds. If the difference is less than a difference threshold, then an adjustment factor can be determined, and that adjustment factor can be added to future measurements of the sensor 210. If the difference is greater than the difference threshold, then maintenance of the sensor 210 can be scheduled. Similar computations can be performed for other measured and known properties of the film on the reference target.

In one embodiment, the one or more integrated reference targets 215 include a calibration target at a fixed position on the substrate holder 206. The calibration target can be a bare metal or silicon target. In one embodiment, the calibration target is a stainless steel target. The calibration target may cause spectral reflections on the sensor 210 when it has a first particular position relative to the sensor 210 (e.g., when it is directly beneath the sensor 210) and/or may cause spectral reflections on the camera 208 when it has a second particular position relative to the camera 208. The calibration target rotates with the chuck, and can be used to locate and/or calibrate a center of a sensor head of sensor 210 relative to a center of a sensor head of camera 208. The R and theta values of the substrate holder 206 that are associated with a sensor measurement of sensor 210 that results in a spectral reflection can be used to determine where the sensor 210 is relative to the calibration target. Similarly, the R and theta values of the substrate holder 206 that are associated with a camera measurement of camera 208 that results in an image in which the calibration target is at a center of the image can be used to determine where the camera 208 is relative to the calibration target. The r-theta value associated with the spectral reflection of the sensor 210 and the r-theta value associated with the centered calibration target image of the camera 208 may together be used to determine relative positions of the camera 208 and the sensor 210. In one embodiment, controller 212 causes the substrate holder to rotate and moves the substrate holder linearly to position the substrate holder such that the target is located and centered in an image of the camera 208. The substrate holder 206 is then translated so that the target is beneath a head of the sensor 210. This can be achieved by moving the substrate holder until a reading of the sensor 210 has a maximum value. The distance between the position of the substrate holder at which the target was in the center of images generated by the camera and the position of the substrate holder at which the target was directly beneath the sensor 210 may then be determined.

In some embodiments, the system 200 includes one or more diffusers 270 positioned above the substrate holder 206 (and above the substrate 214 when the substrate 214 is placed on the substrate holder 206). The one or more diffusers 270 may flow a gas (e.g., clean dry air, nitrogen, and/or another gas) towards the substrate 214 to prevent particles from migrating onto the substrate 214. The diffusers 270 may flow the gas toward the substrate at any angle, such as at a 90 degree angle, at an obtuse angle and/or at an acute angle. In some embodiments, the system 200 further includes an exhaust 272 to exhaust gas (e.g., the gas output by the diffuser(s) 270) and/or any particles moved by the gas out of an enclosure of the system 200. The exhaust 272 may pull particles away from the substrate 214 in embodiments.

Figure 2B:
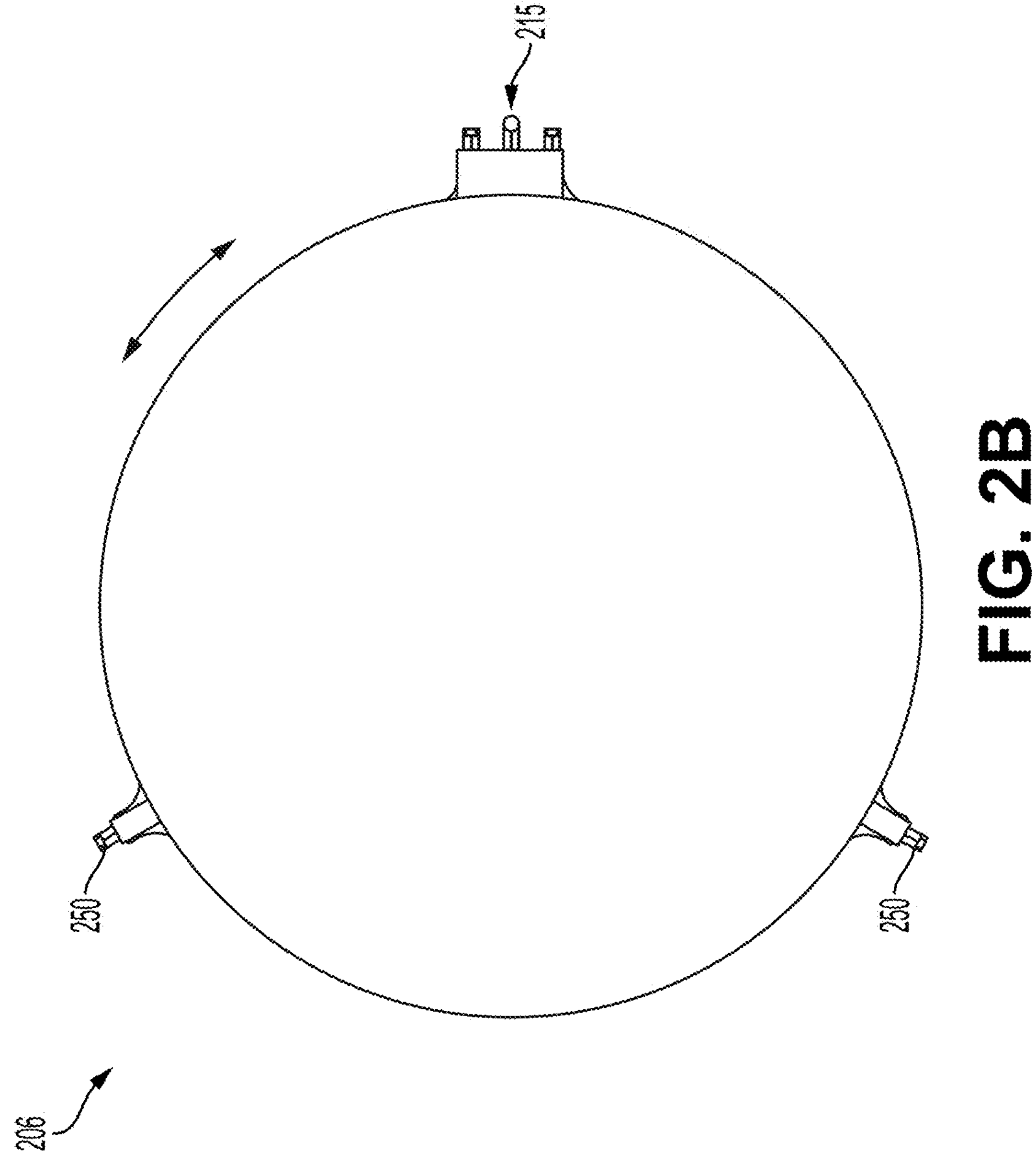
FIG. 2B is a top-down schematic diagram of a substrate holder of a substrate measurement system, according to some embodiments.

FIG. 2B is a top-down schematic diagram of the substrate holder 206, according to some embodiments. The substrate holder 206 may rotate clockwise and/or counterclockwise about an axis at a center of the substrate holder 206 in embodiments. As shown, the substrate holder 206 includes one or more integrated reference targets 215. In one embodiment, the substrate holder 206 includes a plurality of integrated stops (e.g., wafer stops) 250 to prevent the substrate 214 from moving off of the substrate holder 206 if a holding force such as vacuum pressure or electrostatic force is lost. In one embodiment, the substrate holder 206 includes three integrated stops arranged about a periphery of the substrate holder 206. The stops 250 can be adjustable, and a distance of each of the stops from a center of the substrate holder 206 can be adjusted. In one embodiment, the stops 250 are evenly arranged about the perimeter of the substrate holder 206.

Figure 3:
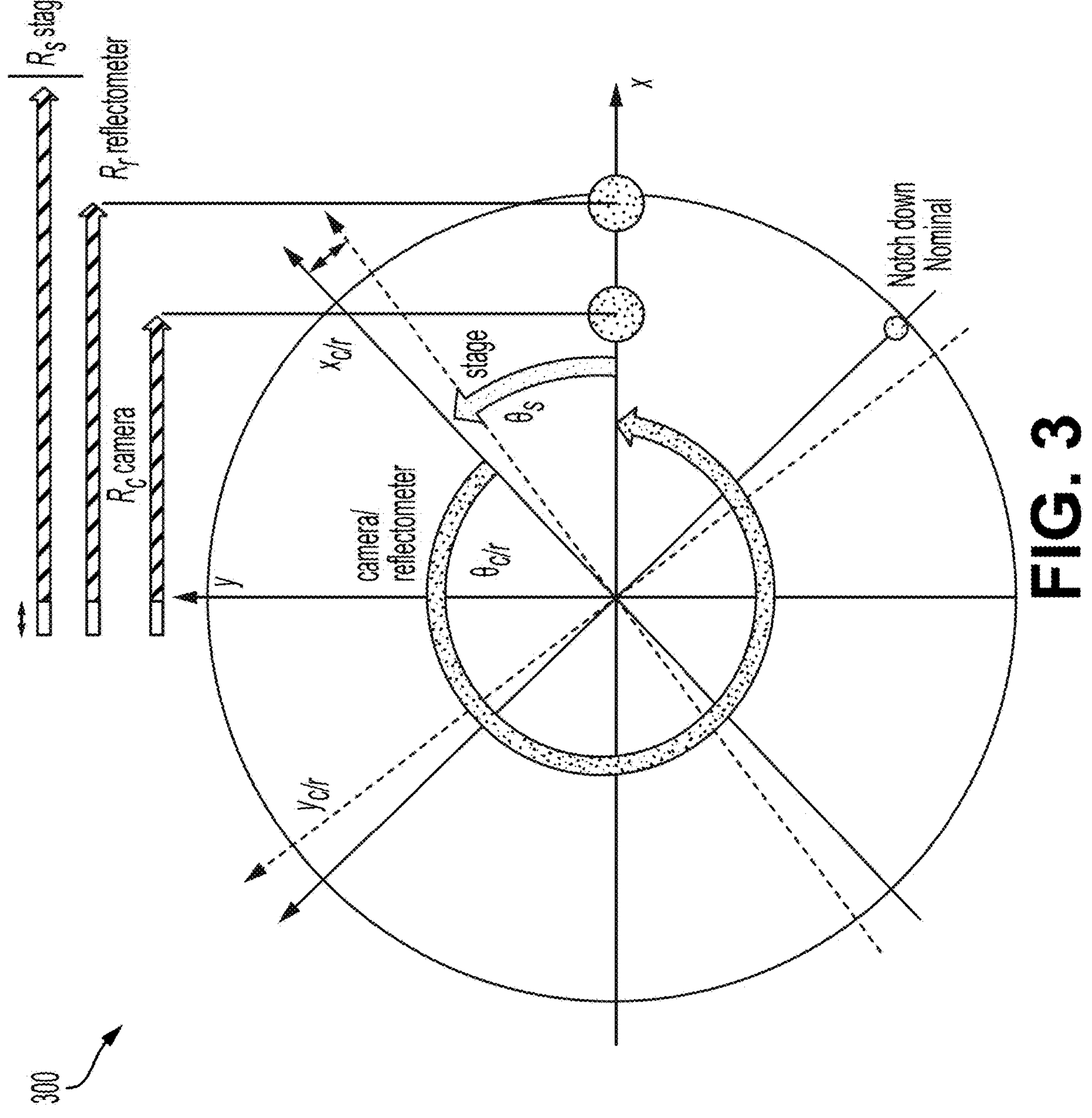
FIG. 3 is a schematic diagram representing rotational and linear coordinates of a substrate holder of a substrate measurement system, according to some embodiments.

FIG. 3 is a top down schematic diagram representing rotational coordinates of a substrate holder of a substrate measurement system ("system") 300, according to some embodiments. system 300 can be the same as or similar to the system 101 of FIG. 1 and/or the system 200 of FIG. 2A. The substrate holder can be the same or similar to the substrate holder 206 of FIGS. 2A-B. The substrate holder can be positioned on a stage, which can be rotated about a rotational axis (such as first axis 203) to cause the substrate holder to also rotate. In addition, the stage can be moved about a linear axis such as second axis 205 to cause the substrate holder to also be moved. These motions allow the substrate holder, and thus any substrate secured to the substrate holder, to move according to an r-theta motion. In other words, the rotational motion allows the substrate holder to rotate by an azimuthal angle, while the linear motion allows the substrate holder to move in a radial direction, thus allowing for a full range of motion of the substrate holder and measurement of an entire surface of the substrate.

The motion system driving the stage can be synchronized with a camera and/or a reflectometer sensor through digital trigger signals. The digital trigger signals can be transmitted via a network. The network may allow for sending the trigger signals to control the motion system at a specific rate (e.g., 1 kilohertz (kHz)).

The substrate holder can be positioned at an initial position defined by its radial and angular coordinates (e.g., polar coordinates): ($r_0$, $\theta_0$) which can also be equivalently expressed in rectangular (Cartesian) coordinates: ($x_0$, $y_0$). The camera and the reflectometer can be located above (in a direction along the rotational axis) the substrate holder, and radial distances of $R_c$ and $R_r$, respectively. Therefore, by rotating the substrate holder from its initial angle, $\theta_0$, and by moving the substrate holder linearly from its initial linear coordinate, To, the entire surface of the substrate holder, and thus the substrate secured by the substrate holder, can be scanned.

Figure 4A:
FIGS. 4A-4B are diagrams of an example implementation of a substrate measurement system having a substrate holder designed to minimize noise signal reflection, according to some embodiments.
Figure 4A:
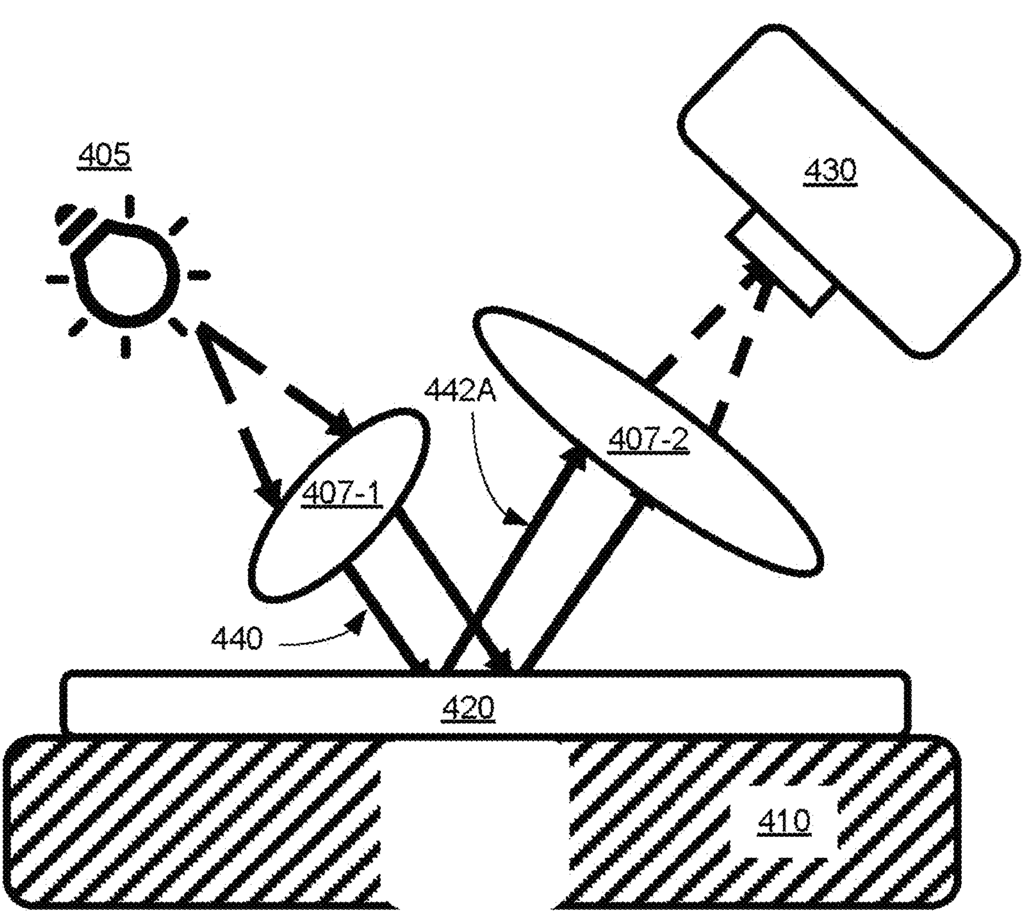
Figure 4B:
Figure 4B:
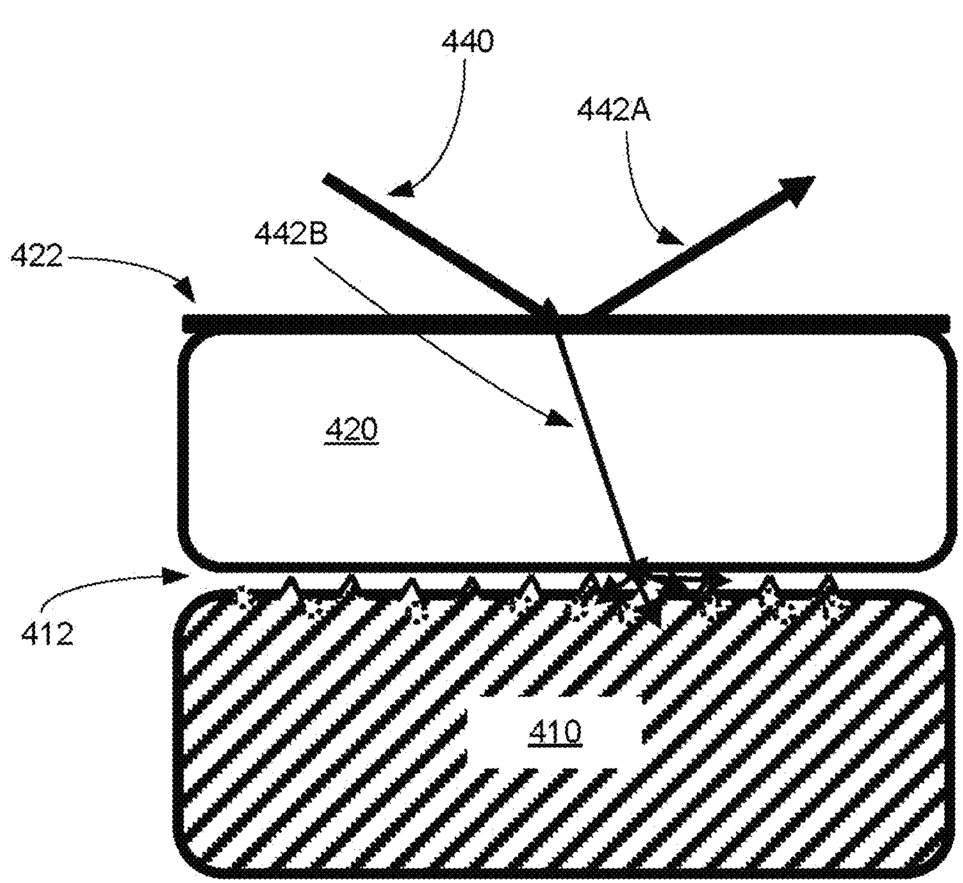

FIGS. 4A-4B are diagrams of an example implementation of a substrate measurement system ("system") 400, according to some embodiments. System 400 can be similar to system 101 of FIG. 1 and/or system 200 of FIG. 2. As shown, system 400 can include an optical beam generator (e.g., light source) 405, an illumination lens 407-1, a collection lens 407-2, a substrate holder 410 having a surface 412, a substrate 420 having a patterning film 422 formed thereon, and an optical detector 430. In some embodiments, the substrate holder 410 includes a mounting plate. In some embodiments, the substrate holder 410 includes a chuck.

The substrate 420 can include any suitable material(s) in accordance with embodiments described herein. In some embodiments, the substrate 420 is a silicon (Si) substrate. In some embodiments, the substrate 420 is a glass substrate. In some embodiments, the patterning film 422 includes a hardmask film. In some embodiments, the patterning film 422 includes a carbon-based hardmask film (e.g., amorphous carbon hardmask film). In some embodiments, the patterning film 422 includes a transparent hardmask film.

The optical beam generator 405 can generate an optical beam 440 that travels through the illumination lens 407-1 and is incident on the surface of the film 422. A portion of the optical beam 440 that reflects off the surface of the patterning film 422, beam portion 442A, can travel through the collection lens 407-2 to be directed to and received by optical detector 430. Another portion of the optical beam 440, beam portion 442B, can travel through the substrate 420 toward the substrate holder 410.

In some embodiments, the surface 412 is designed to minimize noise signal reflection from the substrate holder 410 toward the optical detector 430. For example, the beam portion 442B, when incident on the surface 412, can be scattered in multiple directions away from the optical detector 430. In some embodiments, the surface 412 is designed to achieve a surface reflectivity that ranges from about 200 microinches (μin) to about 2000 μin. In some embodiments, the surface 412 is designed to achieve a surface reflectivity that ranges from about 350 μin to about 1800 μin.

In some embodiments, the surface 412 has a texture defined by a set of holes that is designed to minimize noise signal reflection from the substrate holder 410 toward the optical detector 430. The surface 412 can have any suitable surface texture in accordance with embodiments described herein.

In some embodiments, the surface 412 has a texture defined by a pattern of circular holes. In some embodiments, a circular hole has a diameter that ranges from about 25 micrometers (μm) to about 150 μm. In some embodiments, a circular hole has a diameter that ranges from about 40 μm to about 80 μm. In some embodiments, a circular hole has depth of less than or equal to about 50 μm.

Figures 5A, 5B, 5C, 5D:
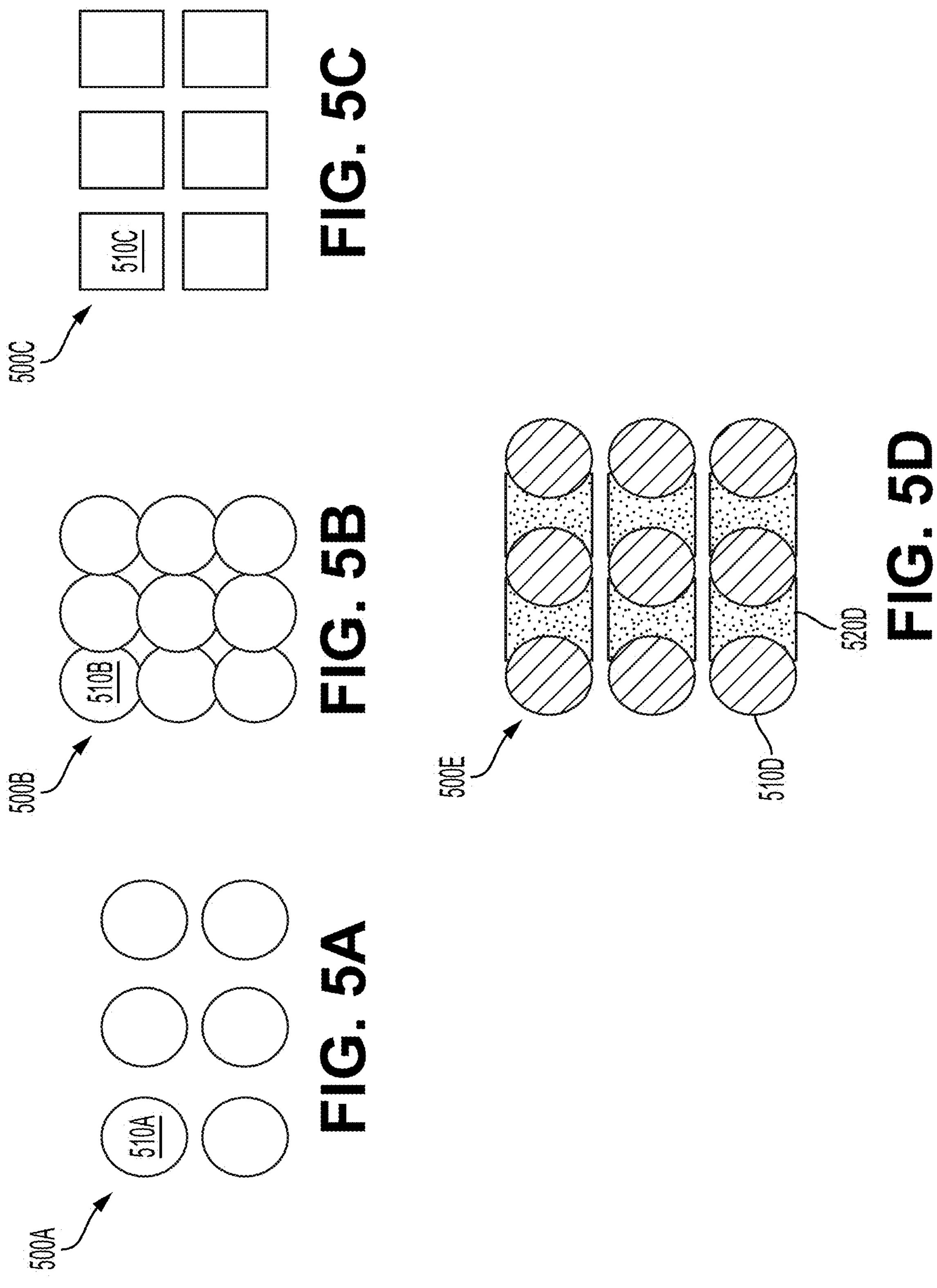
FIGS. 5A-5D are diagrams of example textures of surfaces of substrate holders of substrate measurement systems designed to minimize noise signal reflection, according to some embodiments.

In some embodiments, the pattern includes a first circular hole separated from a second circular hole by a gap in a first direction and from a third circular hole by a gap in a second direction perpendicular to the first direction. An example of such a pattern 500A including circular hole 510A is shown with reference to FIG. 5A.

In some embodiments, the pattern is a cluster pattern in which the circular holes are clustered together (e.g., no gaps between the first circular hole with respect to the second and third circular holes). An example of such a pattern 500B including circular hole 510B is shown with reference to FIG. 5B.

In some embodiments, the surface 412 has a texture defined by a pattern of ovoid holes. In some embodiments, an ovoid hole has a major axis that ranges from about 25 μm to about 150 μm. In some embodiments, an ovoid hole has depth of less than or equal to about 50 μm. In some embodiments, the pattern includes a first ovoid hole separated from a second ovoid hole by a gap in a first direction and from a third ovoid hole by a gap in a second direction perpendicular to the first direction. In some embodiments, the pattern is a cluster pattern in which the ovoid holes are clustered together (e.g., no gaps between the first ovoid hole with respect to the second and third ovoid holes).

In some embodiments, the surface 412 has a texture defined by a pattern of polygonal holes. In some embodiments, a polygonal hole has depth of less than or equal to about 50 μm. In some embodiments, the pattern includes a first polygonal hole separated from a second polygonal hole by a gap in a first direction and from a third polygonal hole by a gap in a second direction perpendicular to the first direction. In some embodiments, the pattern is a cluster pattern in which the polygonal holes are clustered together (e.g., no gaps between the first polygonal hole with respect to the second and third polygonal holes). For example, a polygonal hole can be a rectangular (e.g., square) hole. In some embodiments, a rectangular hole has a length that ranges from about 25 μm to about 150 μm. Other types of polygonal holes are also contemplated. An example of such a pattern 500C including rectangular hole 510C is shown with reference to FIG. 5C.

In some embodiments, the surface 412 has a texture having a pattern with mixed hole types. For example, the surface 412 can have multiple layers, in which a first layer includes holes of a first type (e.g., circular holes) and a second layer includes holes of a second type (e.g., rectangular holes). An example of such a pattern 500D including circular hole 510D and rectangular (e.g., square) hole 520D is shown with reference to FIG. 5D.

In some embodiments, the surface 412 is a porous surface that is designed to minimize noise signal reflection from the substrate holder 410 toward the optical detector 430. In some embodiments, the surface 412 has a porosity that ranges from about 10% to about 90%.

Figure 6:
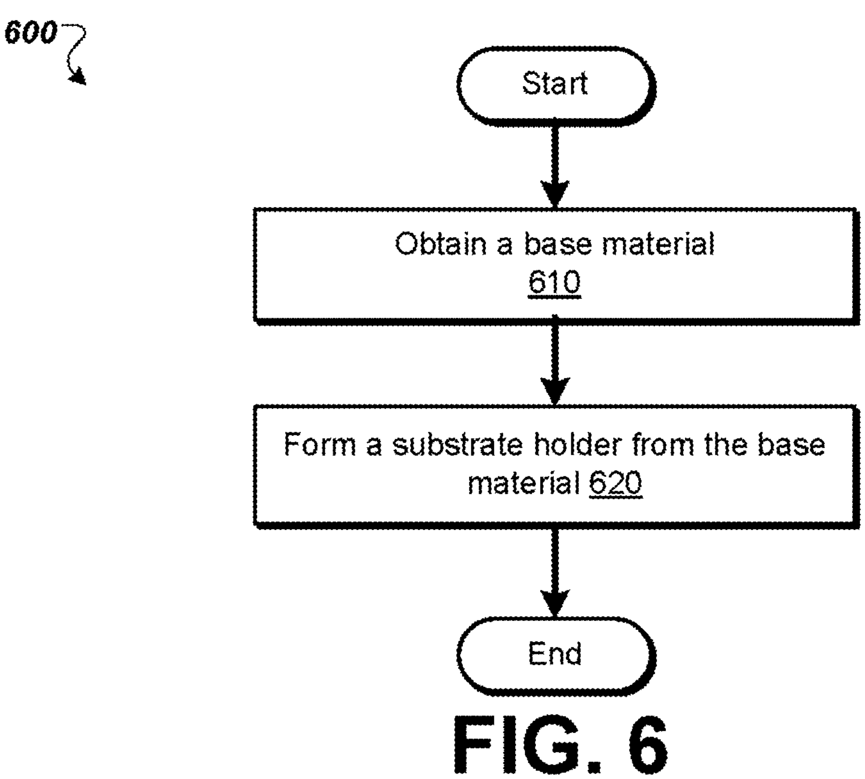
FIG. 6 is a flow diagram of an example method of fabricating a substrate holder of a substrate measurement system designed to minimize noise signal reflection, according to some embodiments.

FIG. 6 is a flow diagram of an example method of fabricating a substrate holder of a substrate measurement system designed to minimize noise signal reflection, according to some embodiments.

At block 610, a base material is obtained. The base material can include any suitable material for fabricating a substrate holder (e.g., chuck). In some embodiments, the base material includes a metal.

At block 620, a substrate holder is formed from the base material. In some embodiments, the substrate holder includes a chuck. Forming the substrate holder can include forming the substrate holder to have a surface to receive a substrate. The surface of the substrate holder is formed to cause an optical beam incident on the surface to scatter in at least one direction away from an optical detector located above the substrate holder. In some embodiments, the surface of the substrate holder is formed to achieve a surface reflectivity that ranges from about 200 μin to about 2000 μin. In some embodiments, the surface of the substrate holder is designed to achieve a surface reflectivity that ranges from about 350 μin to about 1800 μin.

In some embodiments, the surface of the substrate holder has a texture defined by a pattern of holes. For example, the pattern of holes can include at least one of: circular holes, ovoid holes, or polygonal holes. In some embodiments, the surface of the substrate holder has a texture defined by a porosity. For example, porosity can range between about 10% to about 90%.

The substrate holder 410 can be formed using any suitable technique. In some embodiments, the substrate holder is formed from the base material using a mechanical process. In some embodiments, the substrate holder is formed from the base material using radiation (e.g., laser and/or electron beam patterning). As an illustrative example, a circular hole can be formed using a laser having a beam size approximately equal to the diameter of the circular hole. In some embodiments, the substrate holder is formed from the base material using acid processing. In some embodiments, the substrate holder is formed from the base material using additive manufacturing (e.g., three-dimensional printing). Further details regarding blocks 610-620 are described above with reference to FIGS. 1-5Ds.

Figure 7:
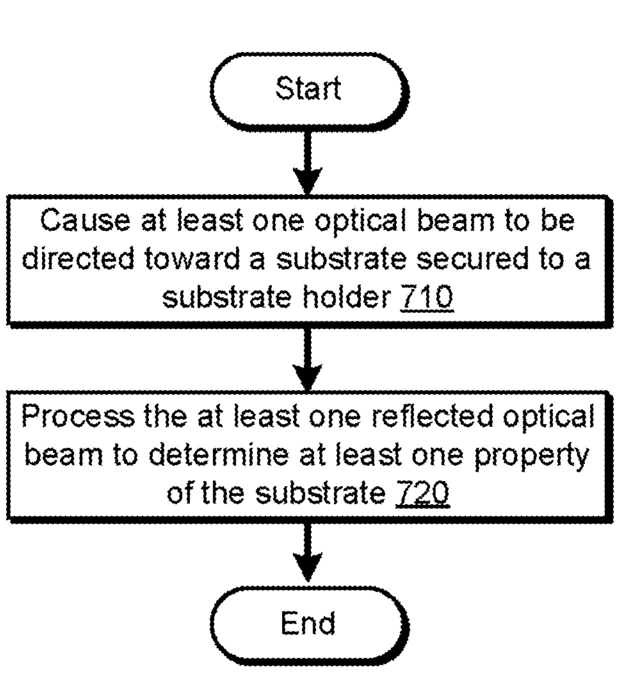
FIG. 7 is a flow diagram of an example method of using a substrate measurement system having a substrate holder designed to minimize noise signal reflection, according to some embodiments.

FIG. 7 is a flow diagram of an example method of using a substrate measurement system having a substrate holder designed to minimize noise signal reflection, according to some embodiments. In some embodiments, method 700 can be performed by processing logic executed by a processor of a computing device. In some embodiments, method 700 can be performed by a processing device. In some embodiments, method 700 can be performed by processing system 100. In some embodiments, method 700 can be performed by system 200 of FIG. 2A.

At block 710, processing logic causes at least one optical beam to be directed toward a substrate secured to a substrate holder. The substrate holder has a surface to receive the substrate. The surface has a texture that causes an optical beam incident on the surface to scatter in at least one direction away from an optical detector located above the substrate holder.

At block 720, processing logic processes at least one reflected optical beam to determine at least one property of the substrate. Further details regarding blocks 710-720 are described above with reference to FIGS. 1-6.

Figure 8:
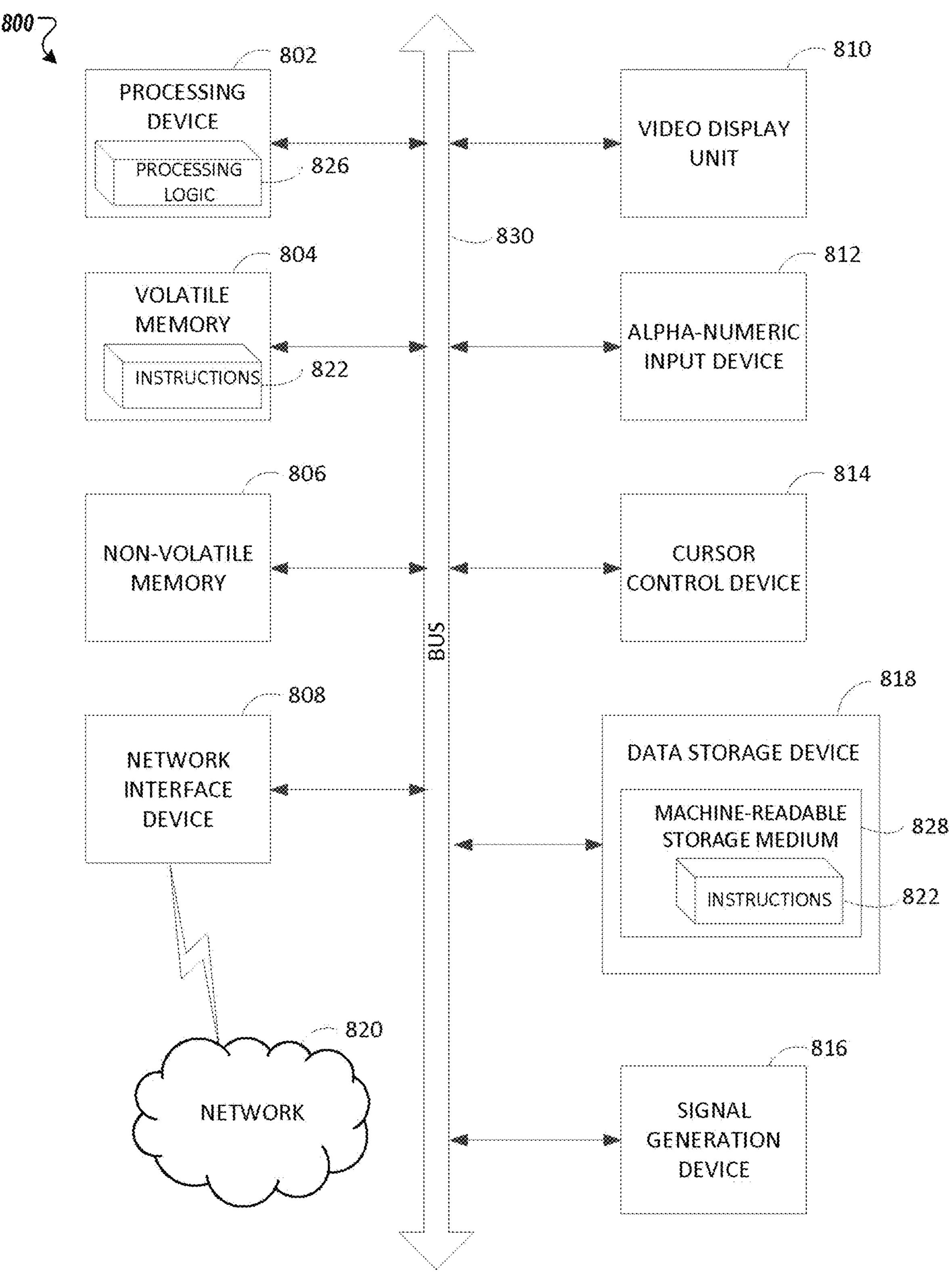
FIG. 8 depicts a block diagram of an example computing device operating in accordance with one or more aspects of the disclosure.

FIG. 8 depicts a block diagram of an example computing device capable of process drift and film thickness determination, operating in accordance with one or more aspects of the disclosure. In various illustrative examples, various components of the computing device 800 may represent various components of a computing device, controller, and/or control panel (e.g., analogous elements described in association with FIGS. 1-4).

Example computing device 800 can be connected to other computer devices in a local area network (LAN), an intranet, an extranet, and/or the Internet. Computing device 800 may operate in the capacity of a server in a client-server network environment. Computing device 800 can be a personal computer (PC), a set-top box (STB), a server, a network router, switch or bridge, or any device capable of executing a set of instructions (sequential or otherwise) that specify actions to be taken by that device. Further, while only a single example computing device is illustrated, the term "computer" shall also be taken to include any collection of computers that individually or jointly execute a set (or multiple sets) of instructions to perform any one or more of the methods discussed herein.

Example computing device 800 may include a processing device 802 (also referred to as a processor or CPU), a main memory 804 (e.g., read-only memory (ROM), flash memory, dynamic random access memory (DRAM) such as synchronous DRAM (SDRAM), etc.), a static memory 806 (e.g., flash memory, static random access memory (SRAM), etc.), and a secondary memory (e.g., a data storage device 818), which may communicate with each other via a bus 830.

Processing device 802 represents one or more general-purpose processing devices such as a microprocessor, central processing unit, or the like. More particularly, processing device 802 can be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. In accordance with one or more aspects of the disclosure, processing device 802 can be configured to execute instructions implementing methods 600 and/or 700 illustrated in FIGS. 6-7.

Example computing device 800 may further comprise a network interface device 808, which can be communicatively coupled to a network 820. Example computing device 800 may further comprise a video display 810 (e.g., a liquid crystal display (LCD), a touch screen, or a cathode ray tube (CRT)), an alphanumeric input device 812 (e.g., a keyboard), a cursor control device 814 (e.g., a mouse), and an acoustic signal generation device 816 (e.g., a speaker).

Data storage device 818 may include a machine-readable storage medium (or, more specifically, a non-transitory machine-readable storage medium) 828 on which is stored one or more sets of executable instructions 822. In accordance with one or more aspects of the disclosure, executable instructions 822 may comprise executable instructions associated with executing methods 600 and/or 700 illustrated in FIGS. 6-7.

Executable instructions 822 may also reside, completely or at least partially, within main memory 804 and/or within processing device 802 during execution thereof by example computing device 800, main memory 804 and processing device 802 also constituting computer-readable storage media. Executable instructions 822 may further be transmitted or received over a network via network interface device 808.

While the computer-readable storage medium 828 is shown in FIG. 8 as a single medium, the term "computer-readable storage medium" should be taken to include a single medium or multiple media (e.g., a centralized or distributed database, and/or associated caches and servers) that store the one or more sets of operating instructions. The term "computer-readable storage medium" shall also be taken to include any medium that is capable of storing or encoding a set of instructions for execution by the machine that cause the machine to perform any one or more of the methods described herein. The term "computer-readable storage medium" shall accordingly be taken to include, but not be limited to, solid-state memories, and optical and magnetic media.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "identifying," "determining," "storing," "adjusting," "causing," "receiving," "comparing," "measuring," "correcting," "applying," "using," "obtaining," "replacing," "performing," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Examples of the disclosure also relate to an apparatus for performing the methods described herein. This apparatus can be specially constructed for the target purposes, or it can be a general purpose computer system selectively programmed by a computer program stored in the computer system. Such a computer program can be stored in a computer readable storage medium, such as, but not limited to, any type of disk including optical disks, compact disc read only memory (CD-ROMs), and magnetic-optical disks, read-only memories (ROMs), random access memories (RAMs), erasable programmable read-only memory (EPROMs), electrically erasable programmable read-only memory (EEPROMs), magnetic disk storage media, optical storage media, flash memory devices, other type of machine-accessible storage media, or any type of media suitable for storing electronic instructions, each coupled to a computer system bus.

The methods and displays presented herein are not inherently related to any particular computer or other apparatus. Various general purpose systems can be used with programs in accordance with the teachings herein, or it may prove convenient to construct a more specialized apparatus to perform the method steps. The structure for a variety of these systems will appear as set forth in the description below. In addition, the scope of the disclosure is not limited to any particular programming language. It will be appreciated that a variety of programming languages can be used to implement the teachings of the disclosure.

The preceding description sets forth numerous specific details such as examples of specific systems, components, methods, and so forth, in order to provide a good understanding of several embodiments of the disclosure. It will be apparent to one skilled in the art, however, that at least some embodiments of the disclosure can be practiced without these specific details. In other instances, well-known components or methods are not described in detail or are presented in simple block diagram format in order to avoid unnecessarily obscuring the disclosure. Thus, the specific details set forth are merely exemplary. Particular implementations may vary from these exemplary details and still be contemplated to be within the scope of the disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method can be altered so that certain operations can be performed in an inverse order or so that certain operation can be performed, at least in part, concurrently with other operations. In another embodiment, instructions or sub-operations of distinct operations can be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. An apparatus comprising:

a substrate holder having a surface to receive a substrate, wherein the surface has a texture defined by a pattern of holes that causes an optical beam incident on the surface to scatter in at least one direction away from an optical detector to be located above the substrate holder.

2. The apparatus of claim 1, wherein the substrate holder comprises a chuck.

3. The apparatus of claim 1, further comprising:

the substrate secured to the substrate holder; and a patterning film disposed on the substrate.

4. The apparatus of claim 1, wherein the pattern of holes at least one of: circular holes, ovoid holes, or polygonal holes.

5. The apparatus of claim 1, wherein the pattern of holes comprises a hole having a depth of less than or equal to about 50 micrometers.

6. The apparatus of claim 1, wherein the texture of the surface is defined by a porosity that ranges from about 10% to about 90%.

7. A system comprising:

a substrate holder having a surface to receive a substrate; and an optical detector located above the substrate holder, wherein the surface has a texture defined by a pattern of holes that causes an optical beam incident on the surface to scatter in at least one direction away from an optical detector to be located above the substrate holder.

8. The system of claim 7, wherein the substrate holder comprises a chuck.

9. The system of claim 7, further comprising:

the substrate secured to the substrate holder; and a patterning film disposed on the substrate.

10. The system of claim 7, wherein the pattern of holes at least one of: circular holes, ovoid holes, or polygonal holes.

11. The system of claim 8, wherein the pattern of holes comprises a hole having a depth of less than or equal to about 50 micrometers.

12. The system of claim 7, wherein the texture of the surface is defined by a porosity that ranges from about 10% to about 90%.

13. A method comprising:

causing, by at least one processing device, at least one optical beam to be directed toward a substrate secured to a surface of a substrate holder;

receiving, by the at least one processing device, at least one reflected optical beam for processing, wherein the surface has a texture defined by a pattern of holes that causes an optical beam incident on the surface to scatter in at least one direction away from an optical detector to be located above the substrate holder; and processing, by the at least one processing device, the at least one reflected optical beam to determine at least one property of the substrate.

14. The method of claim 13, wherein the substrate holder comprises a chuck.

15. The method of claim 13, wherein the substrate has a patterning film disposed thereon.

16. The method of claim 13, wherein the pattern of holes at least one of: circular holes, ovoid holes, or polygonal holes.

17. The method of claim 13, wherein the pattern of holes comprises a hole having a depth of less than or equal to about 50 micrometers.

18. The method of claim 13, wherein the texture of the surface is defined by a porosity that ranges from about 10% to about 90%.

* * * * *